US010997904B2

(12) United States Patent
Liang

(10) Patent No.: US 10,997,904 B2
(45) Date of Patent: May 4, 2021

(54) LINE STRUCTURES FOR DISPLAY SCREENS AND TERMINALS

(71) Applicant: KunShan Go-Visionox Opto-Electronics Co., Ltd., Jiangsu (CN)

(72) Inventor: Defang Liang, Jiangsu (CN)

(73) Assignee: Kunshan Go-Visionox Opto-Electronlcs Co., Ltd., Jiangsu (CN)

(*) Notice: Subject to any disclaimer, the term of this patent is extended or adjusted under 35 U.S.C. 154(b) by 0 days.

(21) Appl. No.: 16/427,619

(22) Filed: May 31, 2019

(65) Prior Publication Data

US 2019/0287456 A1 Sep. 19, 2019

Related U.S. Application Data

(63) Continuation of application No. PCT/CN2018/102446, filed on Aug. 27, 2018.

(30) Foreign Application Priority Data

Oct. 31, 2017 (CN) ......................... 201721426887.6

(51) Int. Cl.
*G09G 3/3225* (2016.01)
*H01L 27/32* (2006.01)

(52) U.S. Cl.
CPC ........... *G09G 3/3225* (2013.01); *H01L 27/32* (2013.01); *G09G 2330/00* (2013.01)

(58) Field of Classification Search
None
See application file for complete search history.

(56) References Cited

U.S. PATENT DOCUMENTS

| | | | | |
|---|---|---|---|---|
| 9,443,474 | B2 | 9/2016 | Eom et al. | |
| 2008/0266282 | A1* | 10/2008 | Lee .......................... | G09G 3/32 345/211 |
| 2014/0091992 | A1* | 4/2014 | Lee ...................... | G09G 3/3233 345/77 |

FOREIGN PATENT DOCUMENTS

| | | | |
|---|---|---|---|
| CN | 103927968 | A | 7/2014 |
| CN | 106448562 | A | 2/2017 |
| CN | 207352943 | U | 5/2018 |

OTHER PUBLICATIONS

International Search Report in International Application No. PCT/CN2018/102446.
Written Opinion of the International Search Authority in International Application No. PCT/CN2018/102446.
CN 207352943 U _ Espacenet_English_Abstract.
CN 103927968A _ Espacenet_English_Abstract.
CN 106448562A _ Espacenet_English_Abstract.

* cited by examiner

*Primary Examiner* — Ifedayo B Iluyomade
(74) *Attorney, Agent, or Firm* — Ladas & Parry LLP

(57) ABSTRACT

The disclosure discloses a line structure for a display screen including a display substrate, a main power supply line and two branch lines. The display substrate includes a display area and a non-display area. The main power supply line is used to transmit a negative signal power supply (VSS) signal, and a length of the main power supply line is less than a length of a long side of the display area, and two branch lines are electrically connected to an end of the main power supply line and extend toward opposite directions along a signal input side of the display area, respectively.

14 Claims, 2 Drawing Sheets

LINE STRUCTURES FOR DISPLAY SCREENS AND TERMINALS

CROSS REFERENCE

This application is a continuation application of International Application No. PCT/CN2018/102446 filed on Aug. 27, 2018 the disclosures of which is incorporated in their entirety by reference herein. The disclosure claims the priority of Chinese Patent Application No. 201721426887.6 filed on Oct. 31, 2017, entitled "LINE STRUCTURES FOR DISPLAY SCREENS", the entire contents of which are hereby incorporated by reference.

FIELD OF THE DISCLOSURE

The disclosure relates to structures for display screens.

BACKGROUND

With the rapid development of the electronic industry, the penetration rate of electronic products is getting higher and higher, such as a computer, a tablet or a mobile phone. The above electronic products have become necessities in people's daily lives. AMOLED (i.e., Active-Matrix Organic Light-Emitting Diode) has been widely used for its advantages such as high chroma, high contrast, wide viewing angle, self luminous and flexible display. With reference to FIG. 1, in the current AMOLED circuit layout, due to a panel having large size, the difference of (current×resistance) voltage drop between ELVSS and ELVDD across the panel is excessively large, resulting in the phenomenon of uneven display.

SUMMARY

In view of the above, the technical problem to be solved by the disclosure cannot be solved by the prior art. It is known that the size of the panel of the Active-Matrix Organic Light-Emitting Diode is increasing, which causes the (current×resistance) voltage drop between different regions to be too large, so that the optical characteristics of different positions on the panel are inconsistent and the panel is unevenly displayed.

To solve the above problem, the disclosure provides a line structure for a display screen comprising a display substrate, a main power supply line and two branch lines. The display substrate comprises a display area and a non-display area. The main power supply line is used to transmit a negative signal power supply (VSS) signal, and a length of the main power supply line is less than a length of a long side of the display area, and two branch lines are electrically connected to an end of the main power supply line and extend toward opposite directions along a signal input side of the display area, respectively.

According to an exemplary embodiment of the disclosure, the display area comprises a first side, a second side, a third side and a fourth side, the first side is opposite to the second side, the first side is adjacent to the third side and the fourth side, the third side is opposite to the fourth side, and the long sides of the display area are the third side and the fourth side.

According to an exemplary embodiment of the disclosure, one end of the main power supply line receives the negative signal power supply (VSS) signal from the first side of the display area, and the other end of the main power supply line extends to the third side or the fourth side of the display area.

According to an exemplary embodiment of the disclosure, the main power supply line comprises two main power supply lines, and one end of each main power supply line receives the negative signal power supply signal from the first side of the display area, and the other end of each main power supply line extends to the third side and the fourth side of the display area, respectively, and the other end of each main power supply line is connected to the two branch lines, respectively.

According to an exemplary embodiment of the disclosure, the length of the main power supply line is half the length of the long side of the display area.

According to an exemplary embodiment of the disclosure, each of the line length of the two branch lines is smaller than the length of the long side of the display area.

According to an exemplary embodiment of the disclosure, the two branch lines comprise a first line and a second line, and a line length of the first line is equal to a line length of the second line.

According to an exemplary embodiment of the disclosure, the two branch lines comprise a first line and a second line, the first line and the second line have a same cross-sectional area, the cross-sectional area of the main power supply line is the same as the cross-sectional area of the two branch lines.

According to an exemplary embodiment of the disclosure, the two branch lines are located on the same linear extending path.

According to an exemplary embodiment of the disclosure, the main power supply line and the two branch lines are parallel to the signal input side of the display area.

To solve the above technical problem, the disclosure provides a terminal including the above line structure for the display screen.

The line structure for the display screen improves shortcomings of the prior art. The disclosure provides a manner of inputting a signal of a line on average to both ends of the screen so that the signal intensity received by the screen is constant, reducing the problem of uneven display caused by the excessively large difference of the (current×resistance) voltage drop.

BRIEF DESCRIPTION OF THE DRAWINGS

The drawings described herein are provided for further understanding the disclosure and as a part of the disclosure. The exemplary embodiments of the disclosure and description thereof are used to explain the disclosure and not as any improper limitation to the disclosure. In the drawings.

DETAILED DESCRIPTION OF PREFERRED EXEMPLARY EMBODIMENTS

Figure 1:
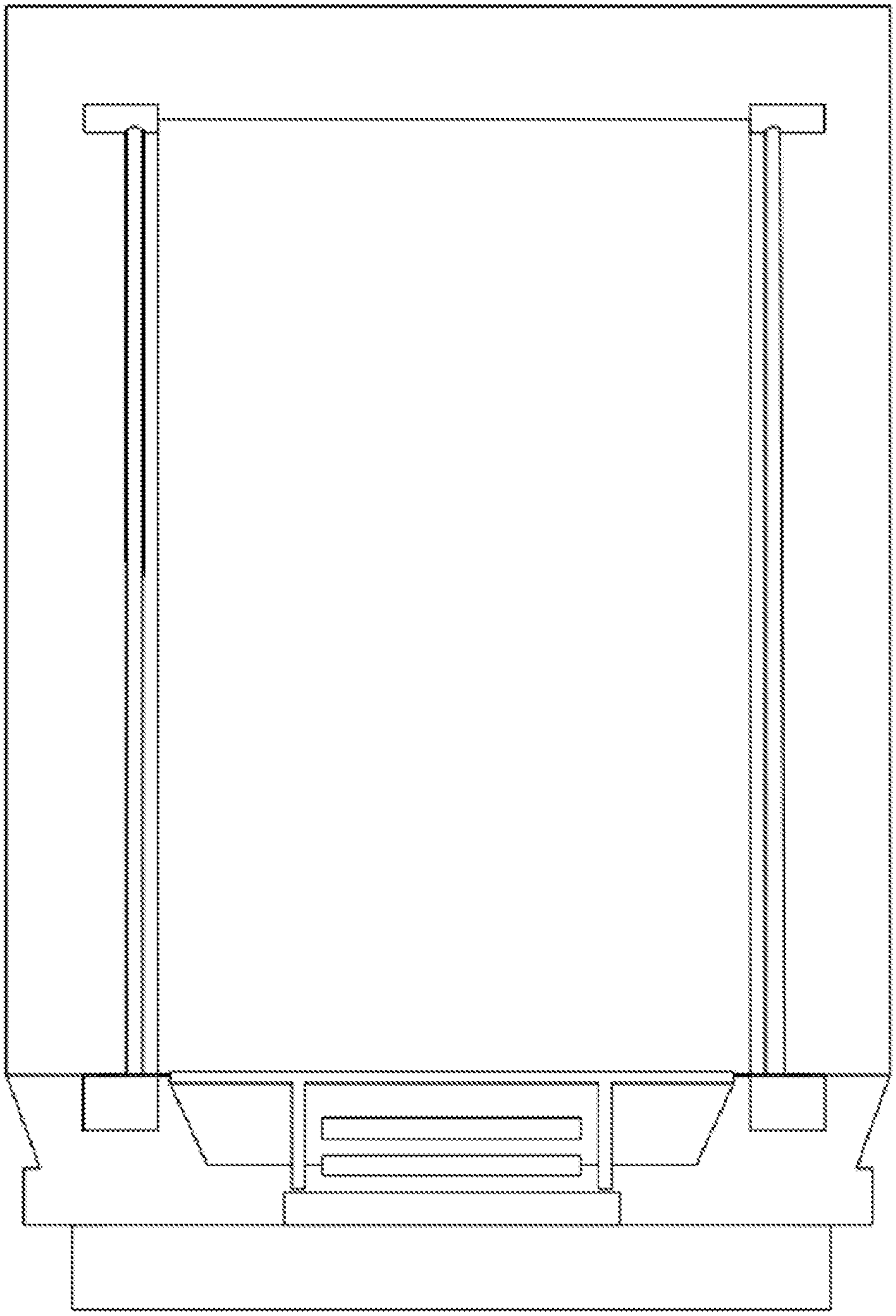
FIG. 1 is a schematic view of the prior art.

In the following, various exemplary embodiments of the disclosure will be disclosed in the drawings, and for the sake of clarity, practical details will be described together in the following description. However, it should be understood that these practical details are not intended to limit the disclosure. That is, in some exemplary embodiments of the disclosure, these practical details are not necessary. In addition, for the simplicity of the drawings, some of the known and conventional structures and components are drawn in the drawings in a simplified schematic representation.

Figure 2:
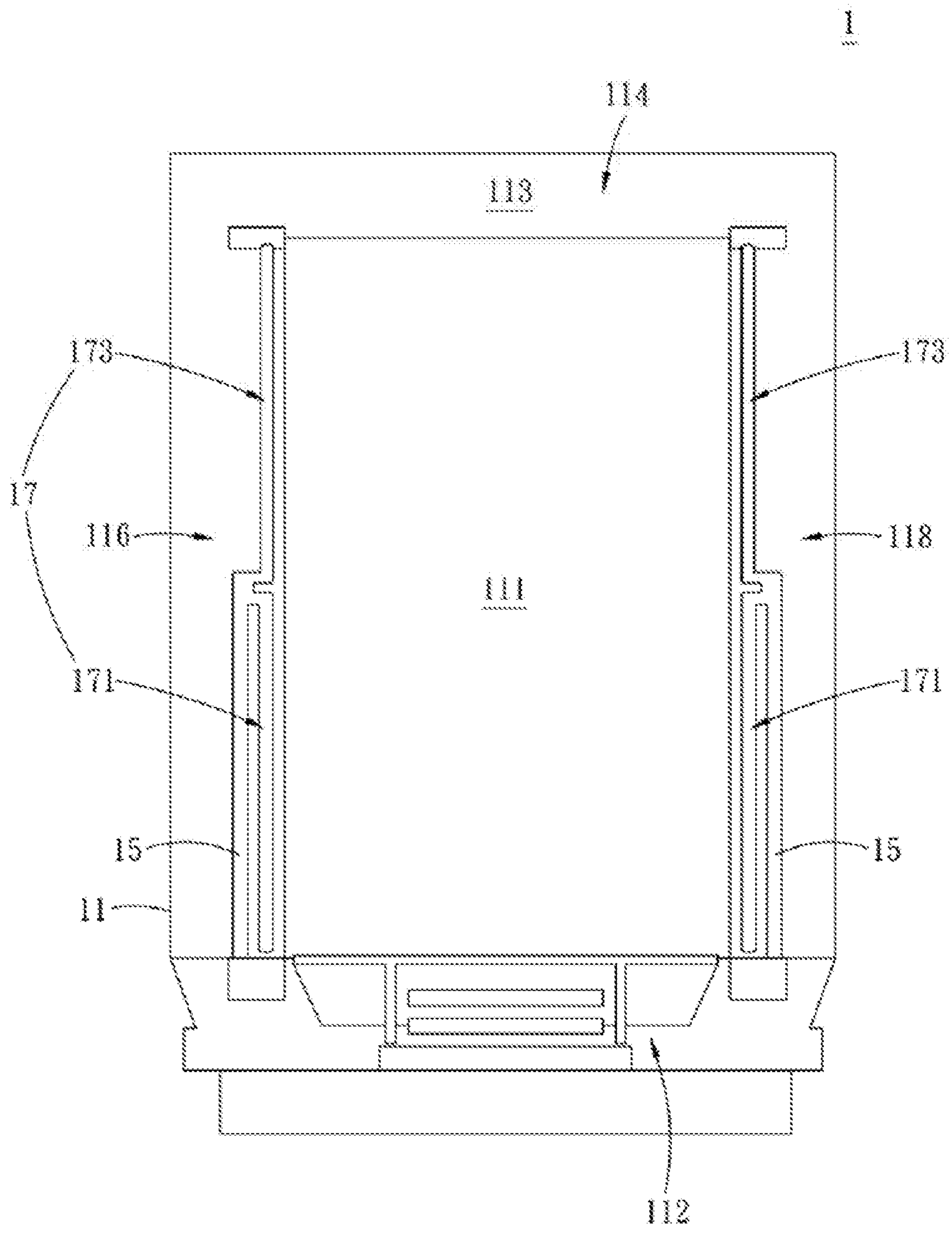
FIG. 2 is a schematic view of a line structure for a display screen of an exemplary embodiment of the disclosure.

Please refer to FIG. 2, and FIG. 2 is a schematic view of a line structure for a display screen of an exemplary embodiment of the disclosure. As shown in the drawing, the present exemplary embodiment provides a line structure 1 for a display screen, which makes the luminance and color of a picture displayed on the display screen even by changing line paths inside the display screen. The line structure 1 for the display screen includes a display substrate 11, a main power supply line 15, and two branch lines 17.

As described above, the display substrate 11 has a display area 111 and a non-display area 113. The main power supply line 15 is used to receive and transmit a negative signal power supply (VSS) signal, and a length of the main power supply line 15 is less than that of a long side of the display area 111. The two branch lines 17 are electrically connected to ends of the main power supply line 15 and extend toward opposite directions along a signal input side of the display area 111, respectively.

In the present exemplary embodiment, the display substrate 11 has the display area 111 and the non-display area 113. The non-display area 113 is arranged in a ring around the display area 111, that is, the display area 111 is located in the non-display area 113, wherein the display area 111 has a first side 112, a second side 114, a third side 116 and a fourth side 118. The first side is opposite to the second side 114, and the first side 112 is adjacent to the third side 116 and the fourth side 118, that is, the third side 116 is opposite to the fourth side 118. The third side 116 and the fourth side 118 are the long sides of the display area. The main power source line 15 is disposed in the non-display area 113 of the display substrate 11. One end of the main power supply line 15 is connected to the first side 112 of the display area and used to receive the negative signal power supply (VSS) signal, and the other end of the main power supply line 15 extends to the third side 116 or the fourth side 118 of the display area 111.

Moreover, as for the main power supply line 15 located at the third side 116 (i.e., the left side), the other end of the main power supply line 15 (i.e., the end of the power supply line) extends toward the display area 111, thereby extending and dividing into the two branch lines 17, i.e., a first line 171 and a second line 173, respectively. The first line 171 extends toward one end along a side of the third side 116 of the display area 111 (i.e., the signal input side) until the end of the first line 171 extends to the end of the third side 116 of the display area 111 and the first line 171 is electrically coupled to the display area 111. The second line 173 also extends toward the other end along the side of the third side 116 of the display area 111 until the end of the second line 173 extends to the other end of the third side 116 of the display area 111 and the second line 173 is electrically coupled to the display area 111. In addition, the arrangement manner of the main power supply line 15 located at the fourth side 118 (i.e., the right side) is also the same as that of the main power supply line 15 located at the third side 116, and therefore will not be described again. The line lengths of the main power supply line 15 and the two branch lines 17 described above each are smaller than the length of the long side of the display panel.

Furthermore, in the present exemplary embodiment, the main power supply line 15 is a signal line of the negative signal power supply (VSS). The first line 171 and the second line 173 are parallel to the third side 116 of the display area 111 (i.e., the signal input side). The first line 171 and the second line 173 may be located on the same linear extending path.

In the present exemplary embodiment, the main power supply line 15 receives the negative signal power supply (VSS) signal, and the main power supply line 15 transmits the signal to the position of the third side 116 or the fourth side 118 of the display area 111 (i.e., not the position corresponding to the two ends of the third side 116 or the fourth side 118) first, then transmits the signal to the first line 171 and the second line 173, respectively, and further to the display area 111. Generally, a single trace, namely the length of the trace path from the starting end of the display area 111 to the finishing end of the display area 111 (i.e., the length of the long side of the display area 111), is long, and thus the difference between the signal intensity at the starting end and the signal intensity at the finishing end is relatively large. After the main power supply line 15 of the present exemplary embodiment first transmits the negative signal power supply (VSS) signal to the end, the trace of the signal intensity thereof is allocated from the first line 171 (or the second line 173) to the display area 111, so the length between the end of the main power supply line 15 and the first line 171 (or the second line 173) is short and the difference between the signal intensity of the end signal of the main power supply line 15 and the signal intensity of the end signal of the first line 171 (or the second line 173) is small, which makes it possible to effectively reduce the uneven display of the display panel.

In the present exemplary embodiment, the line length of the first line 171 is further made the same as the line length of the second line 173 and the cross-sectional area of the first line 171 is also made the same as the cross-sectional area of the second line 173, so that the problem of uneven display of the display panel can be optimized.

In summary, the exemplary embodiments provide a line structure for a display screen, wherein two main power supply lines extend from a non-display area to left and right sides (i.e., a third side and a fourth side) of a display area respectively. An extending end of each main power supply line is electrically connected to two branch lines. The two branch lines extend toward opposite directions along a signal input side, and then are electrically coupled to the display area. Thus, the trace distance of the signal intensity commonly outputted by the end of the main power supply line which is allocated to the display area is shortened, thereby significantly reducing the difference between signal intensities within the display area.

The above description shows and describes several preferred exemplary embodiments of the disclosure. However, as described before, it should be understood that the disclosure is not limited to the forms disclosed herein, and should not be construed as an exclusion to the other exemplary embodiments, other combinations, modifications, and environments are possible which can be modified based on the above teachings or the related technologies or knowledge within the scope of the concept described herein. All changes and modifications made by a person skilled in the art are intended to be within the scope of the appended claims of the disclosure without departing from the spirit and the scope of the disclosure.

What is claimed is:

1. A line structure for a display screen, comprising: a display substrate having a display area and a non-display area; a main power supply line for transmitting a negative signal power supply signal, a length of the main power supply line being less than a length of a long side of the display area; and two branch lines electrically connected to an end of the main power supply line and extending toward opposite directions along a signal input side of the display area, respectively; wherein the display area comprises a first side, a second side, a third side and a fourth side, the first side is opposite to the second side, the first side is adjacent to the third side and the fourth side, the third side is opposite to the fourth side, and the long sides of the display area are the third side and the fourth side; wherein, a single main power supply line corresponds to two branch lines, and the two branch lines are electrically connected to a same end of the single main power supply line; wherein the main power supply line comprises two main power supply lines, and one end of each main power supply line receives the negative signal power supply signal from the first side of the display area, and the other end of each main power supply line extends to the third side and the fourth side of the display area, respectively, and the other end of each main power supply line is connected to the two branch lines, respectively; wherein, the two branch lines comprise a first line and a second line; the first line extends along the each long side of the display area until an end of the first line extends to one end of the each long side of the display area, and the second line extends along the each long side of the display area until an end of the second line extends to the other end of the each long side of the display area.

2. The line structure for the display screen according to claim 1, wherein one end of the main power supply line receives the negative signal power supply signal from the first side of the display area, and the other end of the main power supply line extends to the third side or the fourth side of the display area.

3. The line structure for the display screen according to claim 1, wherein the length of the main power supply line is half the length of the long side of the display area.

4. The line structure for the display screen according to claim 1, wherein each of the line length of the two branch lines is smaller than the length of the long side of the display area.

5. The line structure for the display screen according to claim 1, wherein a line length of the first line is equal to a line length of the second line.

6. The line structure for the display screen according to claim 1, wherein the first line and the second line have a same cross-sectional area, the cross-sectional area of the main power supply line is the same as the cross-sectional area of the two branch lines.

7. The structure for the display screen according to claim 1, wherein the two branch lines are located on the same linear extending path.

8. The line structure for the display screen according to claim 1, wherein the main power supply line and the two branch lines are parallel to the signal input side of the display area.

9. A terminal comprising a line structure for a display screen according to claim 1.

10. The line structure for the display screen according to claim 1, wherein the single main power supply line and the two branch lines corresponding to the single main power supply line are located on a same side of the display area.

11. The line structure for the display screen according to claim 1, wherein the single main power supply line and the two branch lines corresponding to the single main power supply line are located on the third side of the display area.

12. The line structure for the display screen according to claim 1, wherein the single main power supply line and the two branch lines corresponding to the single main power supply line are located on the fourth side of the display area.

13. The line structure for the display screen according to claim 1, wherein the first line and the second line are parallel to the third side of the display area.

14. The line structure for the display screen according to claim 1, wherein the first line is electrically coupled to the display area, and the second line is electrically coupled to the display area.

* * * * *